United States Patent [19]

Gordon et al.

[11] Patent Number: 5,139,825
[45] Date of Patent: Aug. 18, 1992

[54] PROCESS FOR CHEMICAL VAPOR DEPOSITION OF TRANSITION METAL NITRIDES

[75] Inventors: Roy G. Gordon, Cambridge; Renaud Fix, Somerville; David Hoffman, Concord, all of Mass.

[73] Assignee: President and Fellows of Harvard College, Cambridge, Mass.

[21] Appl. No.: 444,112

[22] Filed: Nov. 30, 1989

[51] Int. Cl.$^5$ .................. C23C 16/34; C23C 16/46
[52] U.S. Cl. .................. 427/255.2; 427/255; 427/255.1; 427/314; 423/411
[58] Field of Search .................. 427/255.2, 255, 314; 423/409, 411, 255.1

[56] References Cited

U.S. PATENT DOCUMENTS

| | | | |
|---|---|---|---|
| 3,345,134 | 10/1967 | Heymer et al. | 423/411 |
| 3,370,923 | 2/1968 | Hough | 423/411 |
| 3,591,338 | 7/1971 | Roberts et al. | 423/411 |
| 3,656,995 | 4/1972 | Reedy | 427/255.2 |
| 3,784,402 | 1/1974 | Reedy | 427/255.2 |
| 4,196,233 | 4/1980 | Bitzer et al. | 427/255 |
| 4,414,015 | 11/1983 | Van Laethem et al. | 65/60.3 |
| 4,459,328 | 7/1984 | Mizuhara | 427/190 |
| 4,535,000 | 8/1985 | Gordon | 427/255.2 |
| 4,714,625 | 12/1987 | Chopra et al. | 427/255.2 |
| 4,758,539 | 7/1988 | Brown et al. | 501/96 |
| 4,789,534 | 12/1988 | Laine | 423/440 |

FOREIGN PATENT DOCUMENTS

| | | |
|---|---|---|
| 174743 | 3/1986 | European Pat. Off. ......... 427/255.2 |
| 3837442 | 11/1988 | Fed. Rep. of Germany . |
| 2612946 | 9/1988 | France . |
| 63-230877 | 3/1987 | Japan . |
| 63-120408 | 5/1988 | Japan . |
| 63-174319 | 7/1988 | Japan . |

OTHER PUBLICATIONS

*Dictionary of Organometallic Chemistry*, c. 1984, p. 2251.
"TiN Coatings On M2 Steel Produced By Plasma-Assisted Chemical Vapor Deposition" Hilton et al., *Thin Solid Films*, 154, pp. 377-386 (1987).
Kurtz et al., "Chemical Vapor Deposition of Titanium Nitride at Low Temperatures", *Thin Solid Films*, 140:277 (1986).
Sugiyama et al., "Lower Temperature Deposition of Metal Nitrides by Thermal Decomposition of Organometallic Compounds", J. Electrochem. Soc. 122(11):1545 (Nov. 1975).
Morancho et al., "A Corrosion-Resistant Titanium-Rich Deposit Prepared by Chemical Vapor Deposition at Low Temperature from Tris(2,2'bipyridine) Titanium", J. Electrochem. Soc., 129(4):854 (Apr. 1982).
Morancho et al., Ti(C,N,H) Coatings on Glass Substrates Prepared by Chemical Vapor Deposition Using TRIS(2,2'-Bipyridine)Titanium(0)*, *Thin Solid Films*, 77:155 (1981).

Primary Examiner—Michael Lusignan
Assistant Examiner—Roy V. King
Attorney, Agent, or Firm—Choate, Hall & Stewart

[57] ABSTRACT

A process for depositing a thin film of a transition metal nitride, e.g., titanium nitride, on a substrate is provided. The vapors of a transition metal organometallic coompound or a transition metal amido compound are mixed with ammonia gas and allowed to react near a substrate heated to a temperature in the range of 100° C. to 400° C., resulting in deposition of a film on the substrate.

15 Claims, 3 Drawing Sheets

PROCESS FOR CHEMICAL VAPOR DEPOSITION OF TRANSITION METAL NITRIDES

The U.S. Government has rights to this invention based upon funding by the National Science Foundation Grant Number DMR-8802306.

BACKGROUND OF THE INVENTION

The present invention relates to transition metal nitride films.

Transition metal nitrides, for example titanium nitride, are extremely hard, chemically inert, electrically conductive, high melting, and reflective. This unique combination of properties makes them useful in numerous applications including wear-resistant, corrosion-resistant, decorative, electrically conductive, or optically reflective coatings.

SUMMARY OF THE INVENTION

According to an aspect of the invention, a transition metal nitride coating is produced by forming a vapor mixture of ammonia gas and a transition metal organometallic vapor and exposing the vapor mixture to a heated substrate resulting in deposition of a transition metal nitride coating on the substrate.

According to another aspect of the invention, a transition metal nitride coating is produced by forming a vapor mixture of ammonia gas and a transition metal amido compound and exposing the vapor mixture to a heated substrate resulting in deposition of a transition metal nitride coating on the substrate.

In preferred embodiments, the transition metal organometallic vapor may be a titanium, zirconium, hafnium, or vanadium metal organometallic compound. In other preferred embodiments, the transition metal organometallic vapor or amido compound contains a dialkylamide functional group or a cyclic amido functional group. In other embodiments, the cyclic amido group can be a piperidino or a pyrrolidino group. In other embodiments, a dialkyl amide functional group can be replaced by an alkyl functional group such as a tertiary butyl group.

In other preferred embodiments, the ammonia and transition metal organometallic or amido vapor are individually diluted by an inert carrier gas such as helium, argon, or neon before they are combined in close proximity to the substrate surface. For a chemical vapor deposition reactor having a 1 cm × 4 cm cross-section and a flow rate of 2-3 liters/min, vapor reactants can be combined between 1.0 and 10.0 cm, more preferably between 1.5 and 3.0 cm and most preferably between 2.0 and 2.5 cm from the substrate surface.

In preferred embodiments the substrate is heated to a temperature in the range 100° C. to 400° C., more preferably 150° C. to 300° C. and most preferably 200° C. to 250° C.

The process of the invention allows deposition of transition metal nitride films at lower substrate temperatures than those utilized in previous chemical vapor deposition methods, without production of corrosive by-products which attack the substrate and reactor apparatus. Transition metal nitride films deposited using the process exhibit higher purity than those made according to earlier chemical vapor deposition methods and are smooth, continuous, fine-grained, and pinhole-free. Such high-quality films are suitable for protection of substrates against corrosion, interdiffusion, or abrasion, and for making contacts to solar cells or computer microcircuits. Furthermore, the process can be performed using simple and inexpensive equipment operated at atmospheric pressure obviating expensive and complex vacuum and electrical equipment. The process can also be operated at reduced pressure.

The films produced according to the process provide low-resistance electrical contact to crystalline or amorphous silicon substrates. The films also provide excellent barriers against diffusion or reaction between metals and silicon.

DESCRIPTION OF THE PREFERRED EMBODIMENTS

Figure 1:
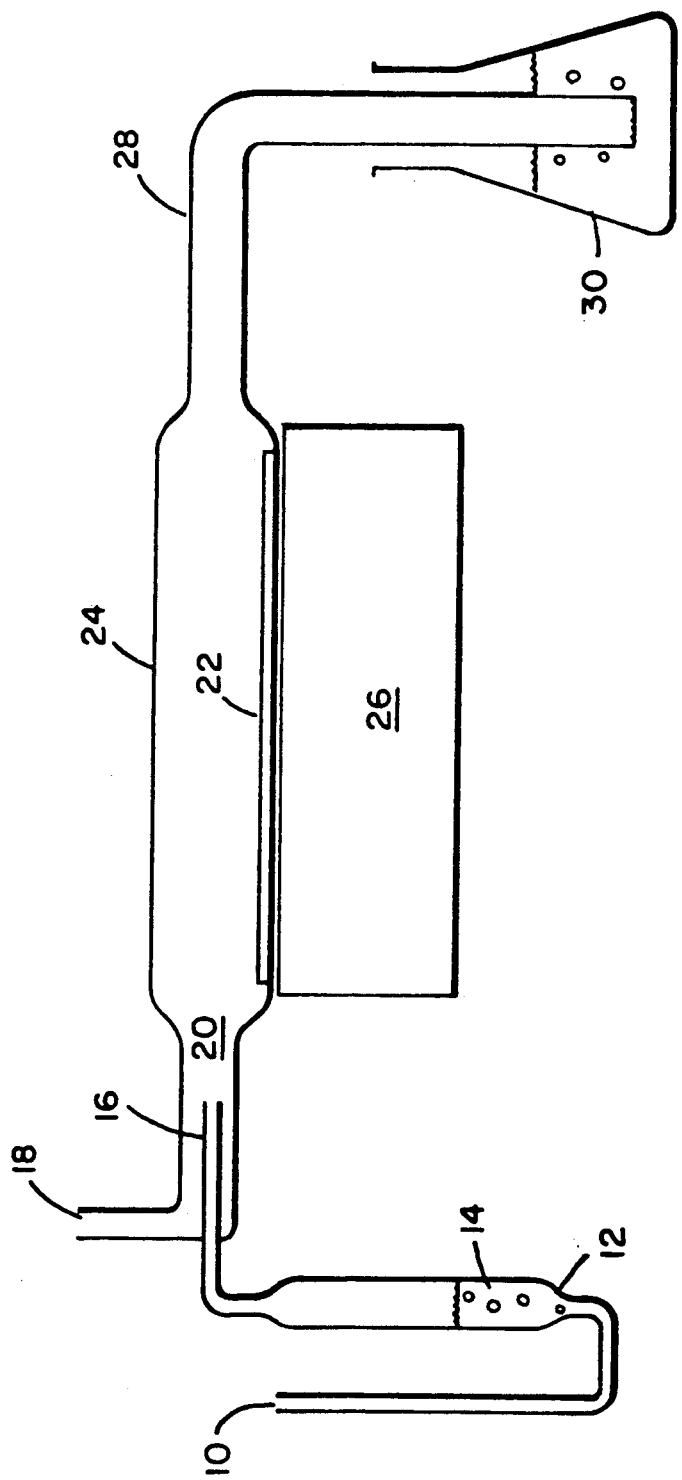
FIG. 1 is a schematic representation of a chemical vapor deposition apparatus.

The process of the invention is accomplished using a chemical vapor deposition apparatus such as that shown in FIG. 1. Similar apparatuses are commercially available from Applied Materials, Santa Clara, Calif. and Watkins Johnson, Scotts Valley, Calif. Helium carrier gas from a supply (not shown) enters at inlet 10 and passes through bubbler 12 where it entrains vapor of transition metal containing compound 14, and carries the vapor into delivery tube 16. Ammonia vapor, $NH_3$, diluted in helium, enters from a supply (not shown) at inlet 18 and mixes with transition metal-containing compound vapor in mixing region 20. Mixed vapors pass over substrate 22 inside rectangular reactor tube 24 which is heated by hotplate 26. Spent vapors exit through tube 28 into oil bubbler 30, which prevents ambient atmosphere from penetrating into the interior of reactor tube 24.

Preferred metal-containing compounds are tetrakis(dialkylamido) titanium(IV) compounds, having the general formula $Ti(NR_2)_4$, where R is an organic radical such as methyl, ethyl, or propyl. These include derivatives of cyclic amines of general formula $Ti(NR')_4$ where NR' is a cyclic amido group, e.g. tetrakis(piperidino) titanium. The methyl derivative, tetrakis(dimethylamido) titanium is most preferred, because it is the most volatile.

Other suitable metal containing reactants include alkyl substituted derivatives of the dialkylamide mentioned above such as tert-butyl tris(dimethylamido) titanium, $Ti[N(CH_3)_2]_3[C(CH_3)_3]$.

Substrate temperatures are typically in the range of 100° C. to 400° C., preferably in the range 150° C. to 300° C., and most preferably 200° C. to 250° C. At temperatures below 100° C., deposition rates become low, adhesion to the substrates may be poor, and oxygen contamination from traces of water vapor becomes hard to avoid. At temperatures above about 200° C., carbon contamination of the films increases. Oxygen or carbon impurities in the films tend to increase their electrical resistivity and decrease their hardness.

EXAMPLE 1

A rectangular (1 cm×4 cm×50 cm) reaction chamber formed of quartz glass, containing silicon, steel, vitreous carbon or glass substrates was heated on its underside to about 200° C. Pure helium gas (containing less than 0.1 ppm water and 0.2 ppm oxygen) was flowed through the chamber in order to displace oxygen and water vapor. Then helium was passed at a rate of about 1 liter/min through a bubbler of liquid tetrakis(dimethyamido)titanium(IV), $Ti[N(CH_3)_2]_4$, held at a temperature of 60° C. This gas mixture passed through a 1 mm inside diameter delivery line to the reaction chamber. About 2 cm before this line entered the reaction chamber, this gas mixture was combined with 10% (by volume) of ammonia gas diluted with helium at a rate of about 1 liter/min. The combined gas mixtures flowed together over the glass substrate, and out of the reaction chamber to an oil bubbler which prevented backflow of air into the reaction chamber. After a reaction time of 1 minute, the substrate was cooled in pure helium.

Figure 2:
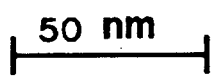
FIG. 2 is a transmission electron micrograph of a titanium nitride thin film deposited at 200° C. on a carbon film.
Figure 3:
FIG. 3 is a transmission electron microscope electron diffraction pattern for a titanium nitride thin film deposited at 200° C. on a carbon film.

Analysis of the deposited film, by X-ray photoelectron spectrosocopy, showed that it consisted of titanium nitride with less than 1% carbon and oxygen impurities. The film was about 100 nanometers thick, and had a mirror-like dark golden surface. A typical film is shown in the transmission electron micrograph of FIG. 2. Electron diffraction showed that the film was composed of polycrystalline titanium nitride as indicated by the typical electron diffraction pattern shown in FIG. 3. Rutherford backscattering analysis determined that there was a slight excess of nitrogen in the film.

The quality of the deposited titanium nitride as a diffusion barrier was tested by depositing titanium nitride on a single-crystal silicon substrate by the process of Example 1. Then a thin layer of gold was sputtered on the titanium nitride. Annealing this structure for 10 minutes at 400° C. produced no diffusion of gold into the silicon, according to Rutherford backscattering measurements on the annealed sample. These results show that titanium nitride films prepared according to the process have good qualities as diffusion barriers, and are reasonably free of voids, cracks, pinholes or other defects.

EXAMPLE 2

The procedure of Example 1 was repeated with tetrakis(diethylamido)titanium in the bubbler heated to 90° C. Similar results were obtained.

EXAMPLE 3

The procedure of Example 1 was repeated with tert-butyl tris(dimethylamido)titanium, $Ti(t-Bu)(N(Me)_2)_3$, in the bubbler heated to 60° C. Similar results were obtained.

EXAMPLE 4

The procedure of example 1 was repeated, except that the ammonia gas reactant was omitted. No deposit was formed.

EXAMPLE 5

The procedure of example 1 was repeated, except that the substrate was heated to 400° C. The deposit formed was contaminated with about 8 atomic percent carbon.

EXAMPLE 6

The procedure of example 1 was repeated, except that polyester plastic sheets were used as substrates and held at a temperature of 150° C. A titanium nitride film of similar quality was deposited.

Similar reactions can occur using zirconium, hafnium, and vanadium dialkylamido or organometallic derivatives.

What is claimed is:

1. A process for making a transition metal nitride coating comprising:
   forming a vaporous mixture of ammonia gas and a vapor of transition metal amido compound; and
   exposing said vaporous mixture to a substrate, said substrate heated to a temperature in the range of 100° C. to 400° C., to deposit a transition metal nitride coating on said substrate.

2. The process of claim 1 wherein said transition metal is a transition metal selected from a group consisting of titanium, zirconium, hafnium or vanadium.

3. The process of claim 1 wherein said transition metal amido compound includes a dialkylamide functional group.

4. The process of claim 3 wherein said dialkylamide functional group includes a dimethylamide functional group.

5. The process of claim 3 wherein said dialkylamide functional group is replaced by a cyclic amide functional group.

6. The process of claim 5 wherein said cyclic amido group is a cyclic amido group selected from a group consisting of piperidino or pyrolidino groups.

7. The process of claim 3 wherein said dialkylamide functional group is replaced by an alkyl functional group.

8. The process of claim 2 wherein said transition metal amido compound includes a tertiary butyl group.

9. The process of claim 1 wherein said ammonia gas and said transition metal compound are individually diluted with an inert carrier gas before they are combined in close proximity to said substrate.

10. The process of claim 9 wherein said inert carrier gas is a gas selected from the group consisting of helium, argon, or neon.

11. The process of claim 2 wherein said substrate is heated to a temperature in the range of 150° C. to 300° C.

12. The process of claim 2 wherein said substrate is heated to a temperature in the range 200° C. to 250° C.

13. The process of claim 2 wherein said substrate is silicon, vitreous carbon, glass, steel, or polyester.

14. The process of claim 2 wherein said transition metal amido compound is tetrakis (dimethylamido) titanium.

15. Process of claim 2 wherein said process is operated at a reduced pressure.

* * * * *

UNITED STATES PATENT AND TRADEMARK OFFICE
CERTIFICATE OF CORRECTION

PATENT NO. : 5,139,825

DATED : August 18, 1992

INVENTOR(S) : Roy G. Gordon, Renaud Fix and David Hoffman

It is certified that error appears in the above—identified patent and that said Letters Patent is hereby corrected as shown below:

In the abstract: please delete "organometallic coampound" and insert therefor -- organometallic compound --;

In the abstract: please delete "100° C. to 400° C," and insert therefor -- 100° C to 400° C, --;

Column 1, line 55: please delete "100° C. to 400° C.," and insert therefor -- 100° C to 400° C, --;

Column 1, line 56: please delete "150° C. to 300° C." and insert therefor -- 150° C to 300° C --;

Column 1, line 56-57: please delete "200° C." and insert therefor -- 200° C --;

Column 2, line 19: please delete "200° C." and insert therefor -- 200° C --;

Column 2, line 23: please delete "200° C." and insert therefor -- 200° C --;

Column 2, line 45: please delete "(-dialkylamido)" and insert therefor -- (dialkylamido) --;

Column 2, line 60: please delete "100° C. to 400° C.," and insert therefor -- 100° C to 400° C, --;

Column 2, line 60: please delete "150° C. to 300° C.," and insert therefor -- 150° C to 300° C, --;

Column 2, line 61: please delete "200° C." and insert therefor -- 200° C --;

UNITED STATES PATENT AND TRADEMARK OFFICE
CERTIFICATE OF CORRECTION

PATENT NO. : 5,139,825
DATED : August 18, 1992
INVENTOR(S) : Roy G. Gordon, Renaud Fix and David Hoffman It is certified that error appears in the above—identified patent and that said Letters Patent is hereby corrected as shown below:

Column 2, line 62: please delete "100° C.," and insert therefor -- 100° C, --;

Column 2, line 65: please delete "200° C." and insert therefor -- 200° C --;

Column 4, line 23: please delete "100° C. to 400° C.," and insert therefor -- 100° C to 400° C, --; and Signed and Sealed this Ninth Day of November, 1993

Attest:

BRUCE LEHMAN

Attesting Officer

Commissioner of Patents and Trademarks